United States Patent
Ernst et al.

(10) Patent No.: US 8,173,545 B2
(45) Date of Patent: May 8, 2012

(54) METHOD FOR THE FABRICATION OF A TRANSISTOR GATE USING AT LEAST ONE ELECTRON BEAM

(75) Inventors: Thomas Ernst, Morette (FR); Stéfan Landis, Voiron (FR)

(73) Assignee: Commissariat a l'Energie Atomique, Paris (FR)

( * ) Notice: Subject to any disclaimer, the term of this patent is extended or adjusted under 35 U.S.C. 154(b) by 486 days.

(21) Appl. No.: 12/299,038

(22) PCT Filed: May 3, 2007

(86) PCT No.: PCT/EP2007/054314
§ 371 (c)(1),
(2), (4) Date: Dec. 2, 2008

(87) PCT Pub. No.: WO2007/128780
PCT Pub. Date: Nov. 15, 2007

(65) Prior Publication Data
US 2009/0203203 A1    Aug. 13, 2009

(30) Foreign Application Priority Data
May 4, 2006  (FR) ..................... 06 51616

(51) Int. Cl.
*H01L 21/44* (2006.01)
(52) U.S. Cl. ....... 438/676; 438/586; 438/587; 438/666; 438/681; 257/E21.624; 257/E21.638
(58) Field of Classification Search ............. 438/163, 438/164, 586, 587, 588, 666, 674, 676, 681; 257/E21.621, E21.635, E21.624, E21.638, 257/E21.618
See application file for complete search history.

(56) References Cited

U.S. PATENT DOCUMENTS

| | | | |
|---|---|---|---|
| 6,413,802 B1 * | 7/2002 | Hu et al. | 438/151 |
| 2004/0063286 A1 | 4/2004 | Kim et al. | |
| 2005/0037603 A1 | 2/2005 | Coronel et al. | |
| 2005/0121706 A1 * | 6/2005 | Chen et al. | 257/288 |
| 2005/0227181 A1 | 10/2005 | Thomson | |
| 2006/0011912 A1 | 1/2006 | Park et al. | |
| 2006/0049429 A1 | 3/2006 | Kim et al. | |

FOREIGN PATENT DOCUMENTS

| JP | 62-263973 A | 11/1987 |
|---|---|---|
| WO | 03/106734 A2 | 12/2003 |

OTHER PUBLICATIONS

Dicks et al; "A Test Chip to Characterise P-MOS Transistors Produced Using a Novel Organometallic Material", IEEE Proceedings 2004—International Conference on Microelectronics Test Structures, vo. 17, Mar. 2004, pp. 183-187.*

(Continued)

*Primary Examiner* — Julio J Maldonado
(74) *Attorney, Agent, or Firm* — Pearne & Gordon LLP (57) ABSTRACT

A microelectronic method for the fabrication of a transistor gate using a precursor material that is suitable for being broken down into at least one metallic material after having been exposed to an electron beam. The invention applies in particular to the fabrication of multi-channel transistors, of the FinFET, suspended-channel, ITS or GAA type.

12 Claims, 8 Drawing Sheets

OTHER PUBLICATIONS

Kratschmer et al; "Nanostructure Fabrication in Metals, Insulators, and Semiconductors Using Semiconductors Using Self-Developing Metal Inorganic Resist", Journal of Vacuum Science and Technology, American Vacuum Society, vo. B4, No. 1, Jan./Feb. 1986, pp. 361-364.*

Dicks et al; "A Test Chip to Characterise P-MOS Transistors Produced Using a Novel Organometallic Material", IEEE Proceedings 2004—International Conference on Microelectronics Test Structures, vol. 17, Mar. 2004, pp. 183-187.

Kratschmer et al; "Nanostructure Fabrication in Metals, Insulators, and Semiconductors Using Semiconductors Using Self-Developing Metal Inorganic Resist", Journal of Vacuum Science and Technology, American Vacuum Society, vol. B4, No. 1, Jan./Feb. 1986, pp. 361-364.

Hisamoto et al; "A Fully Depleted Lean-Channel Transistor (DELTA)—A Novel Vertical Ultrathin SOI MOSFET", IEEE Electron Device Letters, vol. 11 No. 1, Jan. 1990 pp. 36-38.

Choi et al; "Nanoscale CMOS Spacer FinFET for the Terabit Era" IDDD Electron Device Letters, vol. 23, Jan. 1, 2002 pp. 25-27.

Gopal et al; "Metal Delocalization and Surface Decoration in Direct-Write Nanolithography by Electron Beam Induced Deposition", Applied Physics Letters, vol. 85, No. 1, Jul. 5, 2004 pp. 49-51.

Yang et al; "Integrated Tungsten Nanofiber Field Emission Cathodes Selectively Grown by Nanoscale Electron Beam Induced Deposition", Applied Physics Letters, vol. 86, 2005, pp. 183106-1-3.

Fowlkes et al; "Growth and Simulation of High Aspect Ration Nanopillars by Secondary Electron Induced Depostition", Journal of Vacuum Science & Technology, American Vacuum Society, vol. 23, No. 6, Nov. 2005, pp. 2825-2832.

Kim et al; "A Novel MBC (Multi-Bridge Channel) MOSFET: Fabrication Technologies and Characteristics", IEEE Transactions on Nanotechnology, vol. 2, No. 4 Dec. 2003.

Colinge et al; "Silicon-on-Insulator Gate-All-Around Device", IEDM 1990, pp. 595-598.

Coronel et al; "Highly Performant Double Gate MOSFET realised with SON Process- How We Address the Design and Process for the GAA SON Challenges?", IEEE International Conference on Integrated Circuit Design and Technology, 2004, pp. 81-89.

Vieu et al; "Novel Nanofabrication Methdo of High Temperature Metallic Coulomb Blockade Devices", Microelectronic Engineering, vol. 30, 1996, pp. 403-406.

PCT Search Report, Nov. 6, 2007.

French Search Report, Sep. 29, 2006.

* cited by examiner

METHOD FOR THE FABRICATION OF A TRANSISTOR GATE USING AT LEAST ONE ELECTRON BEAM

TECHNICAL FIELD

This present invention relates to the area of integrated circuits, and more particularly to that of transistors, and has as its objective to present an improved microelectronic method for the fabrication of transistor gates, with the breakdown of a precursor material into at least one metallic material that is intended to form a gate material, using at least one electron beam. The invention applies in particular to the fabrication of multi-gate structures, or of so-called "partially surrounding" or "surrounding" or GAA (Gate All Around) gates.

PRIOR ART

A transistor structure is generally formed on a substrate, of the so-called "silicon on insulator" (SOI) type, for example, from a source region and a drain region, in the form, for example, of a first semi-conducting zone and a second semi-conducting zone, respectively connected together by a semi-conducting structure that are intended to play the role of a channel or of several channels in which a current is intended to flow, and that can have the form of a block or a bar, or possibly of several disconnected semi-conducting bars. These semi-conducting bar or bars are covered with a gate that is used to control the amplitude of the current flowing in the channel, or in the channels where appropriate.

In a conventional Metal Oxide Semiconductor (MOS) device, which includes a conventional gate structure, the gate material is deposited onto the channel so as to cover only one face of the semi-conducting block in which this channel is formed. In order to improve the electrical properties of the transistors, and in particular the control of leakage in the cut-off state, for small channel lengths of less than 50 nanometers for example, more complex gate structures appeared.

There exists, for example, a type of gate which will be called "partially-surrounding".

Throughout this present description, a "partially-surrounding" gate will mean that the gate includes at least two regions located in different planes.

A "semi-surrounding" gate can, for example, be a gate in which the gate material is deposited on the channel and is also formed on each of the lateral faces of the latter.

For example, document U.S. Pat. No. 6,413,802 presents a transistor of the so-called "FinFET" type, equipped with such a gate type. This transistor includes a channel in the form of a semi-conducting parallelpipedic bar connecting two semi-conducting blocks, namely the source and the drain. The gate is formed on the top of the semi-conducting parallelpipedic bar and also on the sides of the latter, so as to obtain a covering area of the gate on the channel that is greater in relation to a conventional MOS transistor and thus greater control over the conduction of the latter. Another type of transistor device with partially surrounding gate is presented in the document entitled "*A fully depleted lean-channel transistor (DELTA)—A novel Vertical Ultrathin SOI MOSFET*, Hisamoto et al., *IEEE Electron device letters*, Vol. 11, No. 1 January 1990".

A device with a partially surrounding gate that includes a multi-channel structure formed of several parallel, parallelpipedic and juxtaposed bars on a substrate, with the bars connecting a semi-conducting source region and a semi-conducting drain region, and separated from each other by a distance established by lithography, is presented in the document entitled "*Nanoscale CMOS Spacer FinFET for the Terabit Era*", Choi et al., *IEEE*, 2002.

There also exist transistor gates that are described as "surrounding" or "gate all round" (GAA) types. Throughout this present description, "surrounding gates" will refer to gates in which the gate material is formed all around a portion of the channel semi-conducting block, and, for example, creates a closed ring or band around this block. Document US 2004/0063286 A1 presents a transistor with such a gate type for example. This transistor is equipped with a multichannel structure formed of parallelpipedic semi-conducting bars which are superimposed and created so that an opening exists between each two bars. The parallelpipedic semi-conducting bars are also surrounded or encircled, over a part of their length, by a gate material that fills the openings located between the bars.

The fabrication of "partially surrounding" or "surrounding" gates, on semi-conducting channel structures as previously described, is difficult to implement. This fabrication process makes use of either microelectronic methods of the Damascene type, or methods with stages for the deposition of a gate material, and then for localised removal of this material by etching.

The problem of removing the gate material can also appear, when it involves removing this material at the sides of a bar intended to play the role of channel, such as for a device of the FinFET type as described in document U.S. Pat. No. 6,413,802.

The methods of the Damascene type are often complex and/or require many technological steps.

In particular, methods of the Damascene type require a stage for removal of the gate material by polishing or etching. The methods of the Damascene type generally also have the drawback of including a stage for the formation of gate insulating zones, in contact with the source and drain regions.

Regarding the methods used to achieve deposition and then etching of the gate material, it is generally this etching stage that creates problems, and all the more so when the channel structure on which one wishes to form the gate is non-planar. With isotropic etching methods, and chemical methods in particular, it is difficult to obtain gate dimensions that are critical or uniform. For their part, existing anisotropic etching methods, such as those using plasmas, have the drawback of leaving undesirable residues of gate material, when the formation of the gate requires etching under the channel structure. The etching plasma poses problems for example when the channel structure is formed of vertically aligned semi-conducting bars or of a suspended bar, and when it is then necessary to remove the gate material from under these bars.

We therefore have the problem of finding a new microelectronic method for the fabrication of transistor gates, in particular for forming gates of the "partially surrounding" or "surrounding" type, and which do not include the drawbacks described above.

PRESENTATION OF THE INVENTION

This present invention has as its objective to present an optimised microelectronic method for the fabrication of transistors, and in particular an improved method for the fabrication of transistor gates using a precursor material that can be an organometallic or a compound of a mineral nature that includes at least one metallic element, or a compound in the form of a vapour and that includes at least one metallic element, with said precursor material being suitable to be broken down using at least one electron beam and/or at least one ultra-violet light beam, in at least one metallic material that is intended to form a gate material.

The invention specifies a method for the fabrication of a microelectronic device with one or more transistors, which includes the fabrication of at least one transistor gate on a semi-conducting structure that includes one or more bars designed to play the role of one or more transistor channels, where the fabrication of said gate includes the breakdown of a precursor material into at least one metallic material that is intended to form a gate material, using at least one electron beam and/or at least one ultra-violet light beam.

Such a method can be used in particular to form gates that have a critical measurement or dimension that is uniform or substantially uniform. Such a method can also be used to facilitate the fabrication of gates of complex shape, and that require the removal of a material from under the semi-conducting structure for example, or from zones close to said semi-conducting structure that are difficult to reach by anisotropic etching.

Such a method can be used to get around a stage for the removal of gate material, by polishing or etching for example.

Implementation of the method using an electron beam enables a localised gate to be formed on a portion of the bar or bars.

According to a first aspect, the invention specifies a method for the fabrication of a microelectronic device with one or more transistors, which includes the fabrication of at least one transistor gate on a semi-conducting structure that includes one or more bars designed to play the role of one or more transistor channels, where the fabrication of said gate includes stages for:

a) deposition over at least part of said semi-conducting structure of at least one layer based on an organometallic precursor material, b) exposure of one or more zones of the layer based on the organometallic precursor material to at least one electron beam and/or to at least one light beam, c) reduction of the organometallic precursor material so as to form one or more metallic zones on said structure at the level of said zones exposed to the beam or beams.

Said organometallic material used can be a material that is photosensitive and/or sensitive to the effect of a beam or an emission or a projection of electrons. According to one particular implementation, the organometallic material can be based on the following compound or on the following molecule:

where:
M is a metal that can be chosen from among the following metals—platinum, copper, rhodium, tungsten, iridium, silver, gold, tantalum or palladium;
A is an atom or a molecule that can be chosen from the following list—oxygen, sulphur, the amine group, the amide group, the ester group;
X is an a number chosen from 0 and 1;
L is a ligand;
R is a fluoro-organic group, with the metallic zones formed at stage c) being based on the metal M.

According to a second aspect, the invention specifies a method for the fabrication of a microelectronic device with one or more transistors, which includes the fabrication of at least one transistor gate on a semi-conducting structure that includes one or more bars designed to play the role of one or more transistor channels, where the fabrication of said gate has stages for:

a) deposition over at least part of said semi-conducting structure, of at least one layer of precursor material based on a compound of a mineral nature that includes at least one metallic element and suitable to be broken down into at least one metallic material under the effect of an electron beam, b) exposure of one or more zones of the layer of precursor material to at least one electron beam so as to form, on the semi-conducting structure, one or more metallic zones based on said material at the level of said zones exposed to said beam.

In one option, said compound can be a fluoridated compound. The compound can possibly be chosen from among one of the following compounds—$BaF_2$, $SrF_2$, $MgF_2$, $LaF_3$, $FeF_2$, $CrF_2$ and $AlF_3$.

After exposure to said electron beam, the method of the invention can also include:
the removal of unexposed zones from the layer of precursor material.

In one embodiment of the method in which said semi-conducting structure is deposited on a substrate and includes at least one cavity, or at least one opening, or at least one space between at least two of said semi-conducting bars and/or between at least one semi-conducting bar and the substrate, said deposition of precursor material can be achieved so as to fill in at least one zone of said cavity or of said space or of said opening, by means of said precursor material. The method can also include at least partial removal of the precursor material from said filled-in zone.

According to a third aspect, the invention specifies a method for the fabrication of a microelectronic device with one or more transistors, which includes the fabrication of at least one transistor gate on a semi-conducting structure that includes one or more bars designed to play the role of one or more transistor channels, where the fabrication of said gate has stages for:

a) deposition of the semi-conducting structure in a vapour of a precursor material suitable to be broken down into at least one metallic material under the effect of an electron beam, b) localised exposure of one or more regions of said semi-conducting structure to at least one electron beam, so as to form one or more metallic zones based on said metallic material on said regions of said exposed semi-conducting structure.

In one embodiment of the method, said semi-conducting structure can include a semi-conducting bar or several distinct semi-conducting bars, resting on a substrate.

In one embodiment of the method that can be combined with the previous one, said semi-conducting structure can include at least one first semi-conducting block and at least one second semi-conducting block resting on a substrate, with one or more semi-conducting bars connecting the first block and the second block, and with said semi-conducting bars being suspended above the substrate and/or not being in contact with the substrate.

In one embodiment of the method that can be combined with the previous ones, said semi-conducting structure can include at least two bars aligned in a direction that creates a non-zero angle with the main plane of the substrate, and that are disconnected.

In one embodiment of the method that can be combined with the previous ones, said semi-conducting structure can include at least two bars, aligned in a direction parallel with a main plane of the substrate, and that are disconnected.

The invention can thus be applied in particular to the formation of "partially surrounding" gates. Thus, in one option, at least one of said metallic zones formed can include at least two regions located in distinct planes, with said regions creating, for example, a non-zero angle with at least one of said semi-conducting bars.

The invention can thus be applied in particular to the formation of "surrounding" gates on complex semi-conducting structures that are intended to play the role of a transistor channel, or of a transistor channel with several branches, or of several different transistor channels. Thus, according to another option, at least one of said metallic zones created can form a closed ring or band around at least one of said semi-conducting bars.

After formation of said structure and prior to stage a), the method can also include the deposition of at least one dielectric gate layer.

BRIEF DESCRIPTION OF THE DRAWINGS

This present invention will be understood more clearly on reading the description that follows of given embodiments, by way of a guide only and in no way limiting, with reference to the appended drawings in which.

Identical, similar or equivalent parts in the different figures carry the same numerical references so as to facilitate passage from one figure to the next.

The various parts represented in the figures are not necessarily drawn on a uniform scale, in order to render the figures more readable.

DETAILED PRESENTATION OF PARTICULAR EMBODIMENTS

An example of a microelectronic method, according to the invention, will now be given with reference to FIGS. 1A to 1F.

Figure 1A:
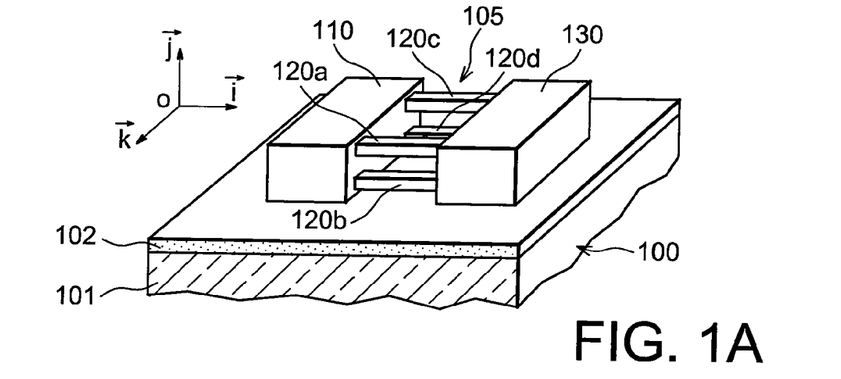
FIGS. 1A to 1F illustrate, in a perspective view, the stages of a method for the creation of a microelectronic device according to the invention.

The method is implemented from at least one semi-conducting structure (105) that is intended to form a channel structure, or a channel with several branches, or a multi-channel structure. In this example, the semi-conducting structure (105) links at least one first semi-conducting block (110), in which at least one source region is intended to be created, and at least one second semi-conducting block in which at least one drain region (130) is intended to be created. The first block (110) and the second block (130) rest on a substrate (100), which can be the semiconductor-on-insulator type, such as of the "Silicon On Insulator (SOI) type or of the "SiGe On Insulator" (SiGeOI) type. For example, the substrate can include a first mechanical support layer (101), which can be based on quartz or based on a semi-conducting material, such as silicon for example, as well as an insulating layer (102) or of buried oxide for example, based on $SiO_2$, resting on the first layer (101), with the insulating layer (102) acting as a support for the first block (110) and the second block (130). The first block (110) and the second block (130) each includes a semi-conducting layer or several superimposed semi-conducting layers, of which at least one semi-conducting layer (not referenced) is in contact with the insulating layer (102). The semi-conducting structure (105) can be in the form of several elements or rods or wires or disconnected semi-conducting bars, for example, as illustrated in FIG. 1A representing a view in perspective of the semi-conducting structure, with four semi-conducting bars (120a, 120b, 120c, 120d). In a case in which the blocks (110, 130) are respectively intended to form several regions of superimposed transistor drains and several regions of superimposed transistor sources, the bars (120a, 120b, 120c, 120d) can be intended to form several transistor channels, when the semi-conducting structure is then described as "multi-channel". The bars (120a, 120b, 120c, 120d), connect in the direction of their length (with the length of the wires (120a, 120b, 120c, 120d), being defined in FIG. 1A in a direction parallel to vector $\vec{i}$ of a rectangular coordinate system [O; $\vec{i}$; $\vec{j}$; $\vec{k}$]), with a first face belonging to the first block (110), and a second face belonging to the second block (130), located opposite to said first face of the first block (110).

The length of the bars (120a, 120b, 120c, 120d) can, for example, be between 50 nanometers and 1 micrometer, or can, for example, be close to or less than the critical dimension of the gate that is intended to be formed, or can be between 40 nanometers and 300 nanometers for example. The bars (120a, 120b, 120c, 120d), can have a thickness (specified in a direction parallel to vector $\vec{j}$ of the rectangular coordinate system [O; $\vec{i}$; $\vec{j}$; $\vec{k}$]) between 3 and 200 nanometers for example, or advantageously between 3 and 20 nanometers, and a width (specified in a direction parallel to vector $\vec{k}$ of the rectangular coordinate system [O; $\vec{i}$; $\vec{j}$; $\vec{k}$]) between 3 nanometers and 1 micrometer for example, or advantageously between 3 and 20 nanometers. In the example illustrated in FIG. 1A, the bars (120a, 120b, 120c, 120d) are suspended, and are not in contact with the substrate, particularly with the insulating layer (102). There thus exists a space between each of the bars (120a, 120b, 120c, 120d), and between the substrate (100) and the bars (120a, 120b, 120c, 120d). In one arrangement option, at least one first bar (120a) and at least one second bar (120b) which is distinct or separate from the first bar, are aligned in a direction that makes a non-zero angle, of 90° for example, with the main plane of the semi-conducting layer (101) or of the insulating layer (102). In a direction substantially parallel to the main plane of the insulating layer (102), a third semi-conducting bar (120c), and a fourth semi-conducting bar (120d), are respectively aligned with the first bar (120a) and with the second bar (120b).

Then (see FIG. 1B), a deposition of a gate dielectric layer (140) is achieved on the semi-conducting structure (105), and in particular around the bars (120a, 120b, 120c, 120d), and on the semi-conducting blocks (110, 130). For example, the dielectric layer (140) can be an oxide layer such as SiO$_2$ or HfO$_2$.

Figure 1B:
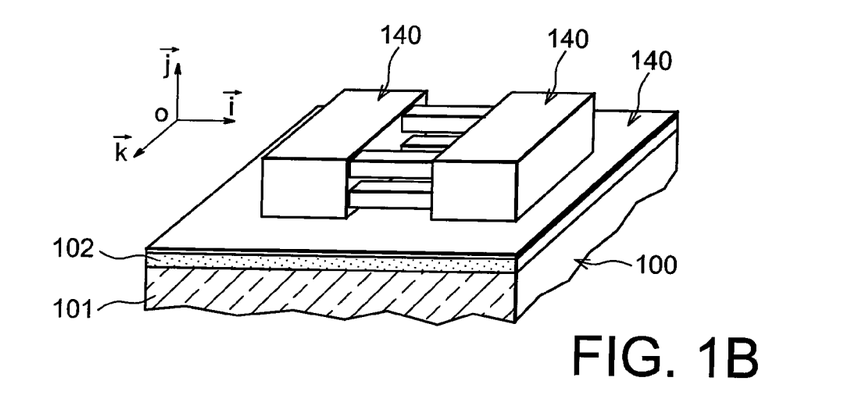

Next one achieve a deposition of a so-called "resist" layer, based on a precursor material (150) that includes at least one metallic element. The precursor material (150) chosen is suitable to be broken down into at least one metallic material after having been exposed to an electron beam.

In one option, the precursor material (150) can be a compound of a mineral nature that includes at least one metallic element and one or more other non-metallic elements. The resist material can be a fluoridated compound that includes at least one metallic element, and can be chosen for example from among one of the following compounds—BaF$_2$, SrF$_2$, MgF$_2$, LaF$_3$, FeF$_2$, CrF$_2$, and AlF$_3$.

According to another option, the precursor resist material (150) can be an organometallic material. This organometallic material can be the following form:

where,
M is a metal that can be chosen from among the following metals: platinum, copper, rhodium, tungsten, iridium, silver, gold, tantalum, palladium;
A is an atom or a molecule that can be chosen from the following list: oxygen, sulphur, the amine group, the amide group, the ester group,
X is an a number chosen from 0 and 1,
L is a ligand,
R is a fluoro-organic group.

Figure 3:
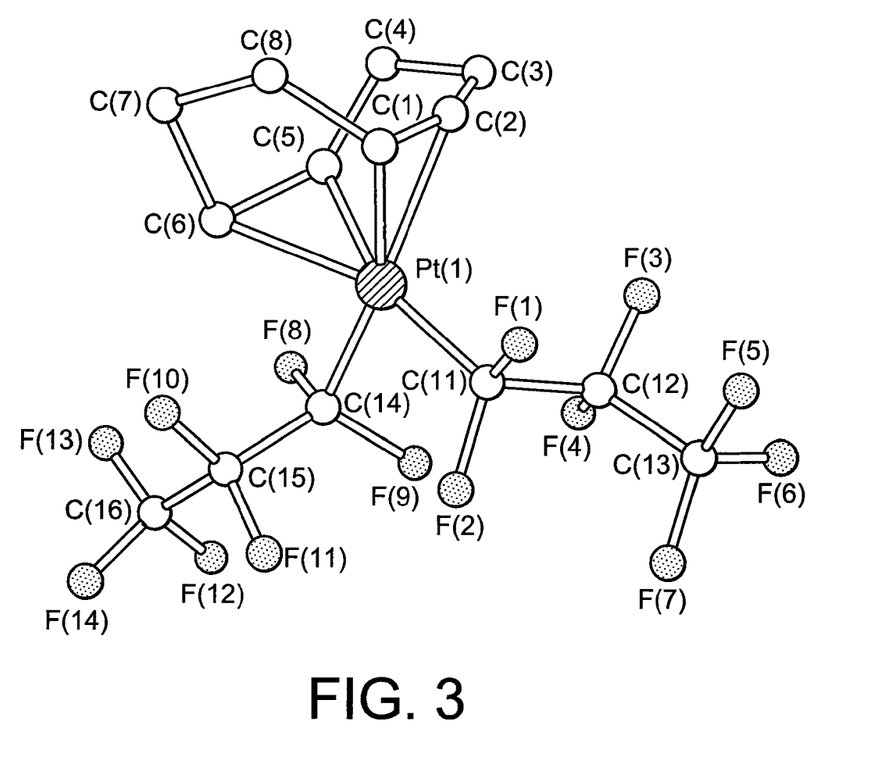
FIG. 3 illustrates an example of a molecule of an organometallic material that is used for the creation of a gate, when using a method of the invention.

According to one particular implementation, the organometallic material can, be formed, for example, based on (C$_3$F$_7$)$_2$PtC$_8$H$_{12}$, the molecule of which is illustrated in FIG. 3. This molecule of (C$_3$F$_7$)$_2$PtC$_8$H$_{12}$ can be synthesised from C$_8$H$_{12}$Br$_2$Pt, whose molecule can have the following form:

(a)

or of C$_8$H$_{12}$Cl$_2$Pd, whose molecule can have the following form:

(b)

Figure 1C:
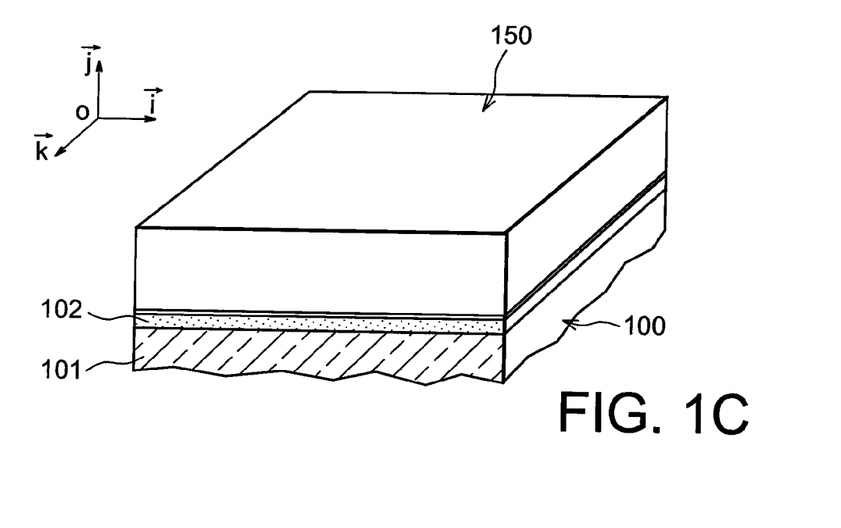

The layer of resist based on a precursor material (150) can be deposited, by "chemical vapour deposition" (CVD) for example, onto the structure (105) and possibly onto the blocks (110, 130) (see FIG. 1C). The thickness of the precursor material (150) deposited can be greater than the height of the semi-conducting blocks (110, 130) and between 10 and 100 nanometers for example. The deposition can be such that the precursor material (150) covers the blocks (110, 130) and encloses or surrounds the bars (120a, 120b, 120c, 120d). In one option, in the case in which the precursor material (150) is an organometallic material, the latter can be deposited by "Metal Organic Chemical Vapor Deposition" (MOCVD).

At least one gate pattern is then created on a part of the structure (105), from the layer of resist based on precursor material (150), by exposing a part of this layer of resist to at least one electron beam (155). The electron beam (155) can in particular be used to penetrate through the semi-conducting structure (105), and to reach parts of the precursor material (150) located under this structure (105) or under the bars (120a, 120b, 120c, 120d). Using the action of the beam (155), certain parts of the resist layer based on precursor material (150) that are located between bars 120a and 120b, and/or between bars 120c and 120d, and/or respectively between bar 120b and the substrate and/or between bar 120d and the substrate, can be attained. The removal of parts of the resist layer based on precursor material (150) not exposed to the beam (155) is also facilitated and is more precise than with conventional removal methods, achieving anisotropic etching for example, using a plasma or an chemical isotropic etching. The beam (155) can possibly be obtained from a set of several electron beams.

Figure 1D:
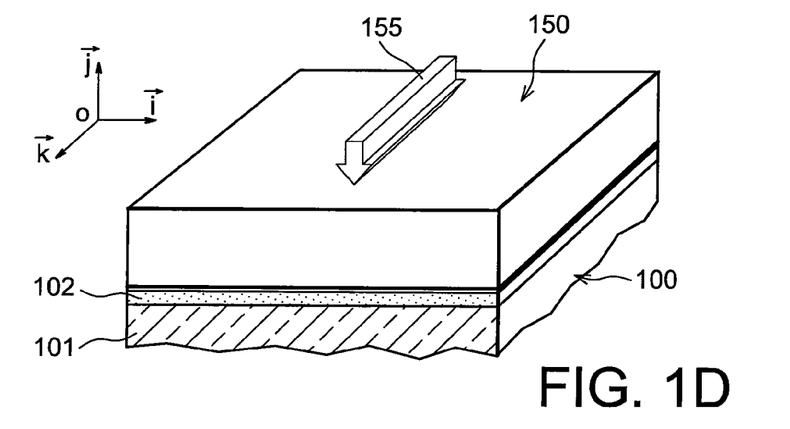
Figure 1E:
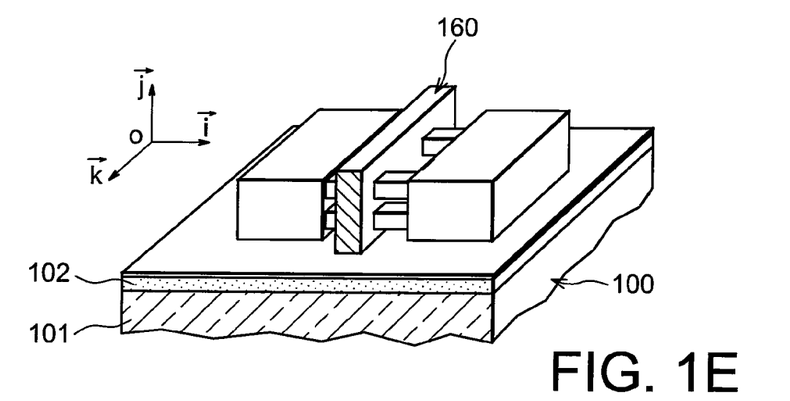
Figure 1F:
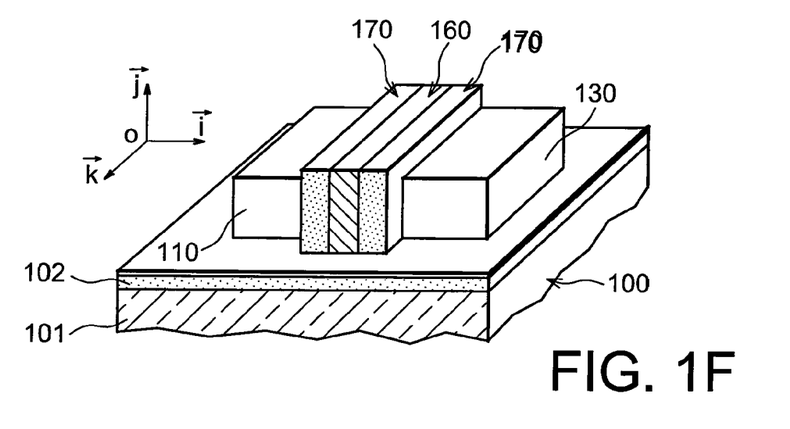

In one option, the exposure of the resist layer based on precursor material (150) can be executed without a mask, by direct writing with the beam (155) onto the precursor material (150) (see FIG. 1D).

According to a variant (not shown), the exposure of the resist layer based on precursor material (150) to an electron beam, can be created through a mask that includes, for example, an opening reproducing the gate pattern that the one wishes to form in the layer of precursor material (150).

The parts of the resist layer based on precursor material (150) exposed to the beam (155), are intended to be transformed into metallic zones. The parts of the resist layer based on precursor material (150) exposed to the beam (155) can form a closed contour around the bars (120a, 120b, 120c, 120d) respectively.

In a case in which the resist precursor material (150) is a mineral compound that includes a metallic element and one or more other non-metallic elements, the action of the electron beam (155) is capable of breaking down the precursor material (150) and of causing evaporation of said other non-metallic elements. After exposure to the electron beam (155), the parts of the layer of precursor material (150) that have been exposed form metallic zones. In a case, for example, in which the resist material (150) is a fluoridated mineral compound that includes a metallic element, chosen from among one of the following materials for example—BaF$_2$, SrF$_2$, MgF$_2$, LaF$_3$, FeF$_2$, CrF$_2$, and AlF$_3$, the action of the electron beam (155) can provoke evaporation of the Fluor and breakdown of said fluoridated compound in at least one metallic material. Thus, according to several examples—the parts of the resist layer based on material (150) exposed to the beam (155) are capable of forming metallic zones based on Ba for a precursor material based on BaF$_2$, or to form metallic zones based on Sr for a precursor material based on SrF$_2$, or to form metallic zones based on Mg for a precursor material based on MgF$_2$, or to form metallic zones based on La for a precursor material based on LaF$_3$, or to form metallic zones based on Fe for a precursor material based on FeF$_2$, or to form metallic zones based on Cr for a precursor material based on $CrF_2$, or to form metallic zones based on Al for a precursor material based on $AlF_3$.

In the case in which the precursor material (150) is an organometallic material, after the exposure stage, a reduction of the organometallic material is also achieved so as to form metallic zones at places in the layers of material (150) that have been exposed to the beam (155). This reduction can include several successive stages of heating and cooling for example. The reduction can include a first stage for example, firstly of heating and then of cooling, all in an inert atmosphere that includes a gas such as dinitrogen. A second stage, firstly of heating and then of cooling, all in atmosphere that includes dioxygen, in an air atmosphere for example, can then be achieved. The reduction can then include a third stage, firstly of heating and then of cooling, all in an atmosphere which includes a reducing gas that includes dihydrogen for example.

One then execute a stage for development of the resist layer, during which the parts of this resist layer based on the precursor material (150), which have not been exposed to the beam (155), are removed.

In the case of an organometallic precursor material (150), this removal can be performed by washing, using dichloromethane for example, or by sublimation. After reduction, the parts of the layer of organometallic material exposed to the beam (155) form a gate block (160) based on the metal M (where M is the metal present in the organometallic molecule described above) surrounding the bars (120a, 120b, 120c, 120d) over part of their length. In the case in which the precursor material (150) is a compound of a mineral nature, such as a fluoridated compound that includes a metallic element like $BaF_2$, $SrF_2$, $MgF_2$, or $LaF_3$, this removal can be performed by dissolving in water for example. In another case in which the precursor material (150) is a compound such as $FeF_2$, $CrF_2$, $AlF_3$, the removal can be performed using an oxidising solution for example, of the so-called "Caro 3:1" type for example, formed from a mixture of 3 volumes of 96% sulphuric acid per volume of 30% oxygenated water for example or of fuming nitric acid (see FIG. 1E).

Figure 2:
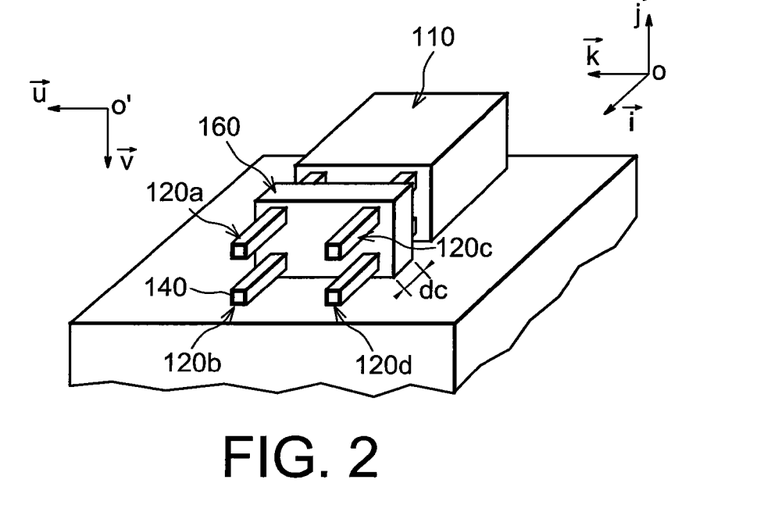
FIG. 2 illustrates, in a view in section, a gate formed using a method of the invention on a structure that includes suspended semi-conducting bars.

FIG. 2 illustrates the microelectronic device after formation of the gate (160), in a view in section in the plane [O'; $\vec{u}$; $\vec{v}$] (indicated in FIG. 1E). The gate (160) is arranged so that zones of gate metal encircle or surround the bars (120a, 120b, 120c, 120d), over at least part of their length, or form a closed ring or band around the bars (120a, 120b, 120c, 120d). The method of formation of the gate (160) employed by the invention is used to obtain a gate than can be described as "self-aligned" to the extent that the critical dimension of the gate or the gate side (referenced dc in FIG. 2 and measured in a direction parallel to vector $\vec{i}$ of the rectangular coordinate system [O; $\vec{i}$; $\vec{j}$; $\vec{k}$]) is uniform or substantially uniform on either side of the bars (120a, 120b, 120c, 120d), whether one is placed, for example, in a plane parallel to plane [O; $\vec{i}$, $\vec{k}$] and located above bars 120a and 120c, or in a plane parallel to plane [O; $\vec{i}$; $\vec{k}$] and located between firstly bars 120a and 120c, and secondly bars 120b and 120d, or in a plane parallel to plane [O; $\vec{i}$; $\vec{k}$] and located between firstly bars 120b and 120d and secondly the substrate (100) (see FIG. 2).

It is then possible to form insulating spacers (170) for the gate (160) by depositing a dielectric material, based on $Si_3N_4$ for example, between the gate (160) and each of the blocks (110, 130). This deposition can be followed by removal of the dielectric material in a part located at the top of the blocks (110) and of the gate (160), using a Chemical Mechanical Polishing (CMP) stage for example (see FIG. 1F).

The microelectronic method according to the invention, for the formation of at least one transistor gate structure using an organometallic precursor material (150) or formed from a compound of a mineral nature that includes at least one metallic element and one or more other non-metallic elements, on a semi-conducting structure that includes at least one semi-conducting block in which a channel structure is intended to be formed, is not limited to what has just been described in detail, and in particular to creation on a structure like the structure (105) described above with reference to FIG. 1A.

The microelectronic method according to the invention can be applied to any type of semi-conducting structure that is intended to create a channel, or a channel with several branches, or several channels. The microelectronic method can be applied to the formation of so-called partially surrounding gates, that is of gates that include at least two regions belonging to distinct planes. The microelectronic method applies in particular to any type of gate described as "Gate All Around" (GAA), in which the gate material encircles or surrounds or forms a ring around at least one semi-conducting bar in which a current is intended to flow. The creation of a GAA gate, can necessitate having to achieve the removal of material from certain zones located under a semi-conducting bar, and/or require a method for precise removal of the gate material in undesirable zones in order to obtain a uniform gate side around the semi-conducting bar. Such removal precision is allowed by the stages of exposure of certain zones of the precursor material (150), and of removal of the unexposed zones of this precursor material (150), as previously described.

In like manner, the microelectronic method applies in particular to the formation of gates on semi-conducting structures resting on a substrate, formed of one or more blocks or semi-conducting bars and that include at least one cavity and/or at least one opening and/or forming at least one space, between said semi-conducting bars for example and/or between at least one of said semi-conducting bars and the substrate.

Figure 7A:
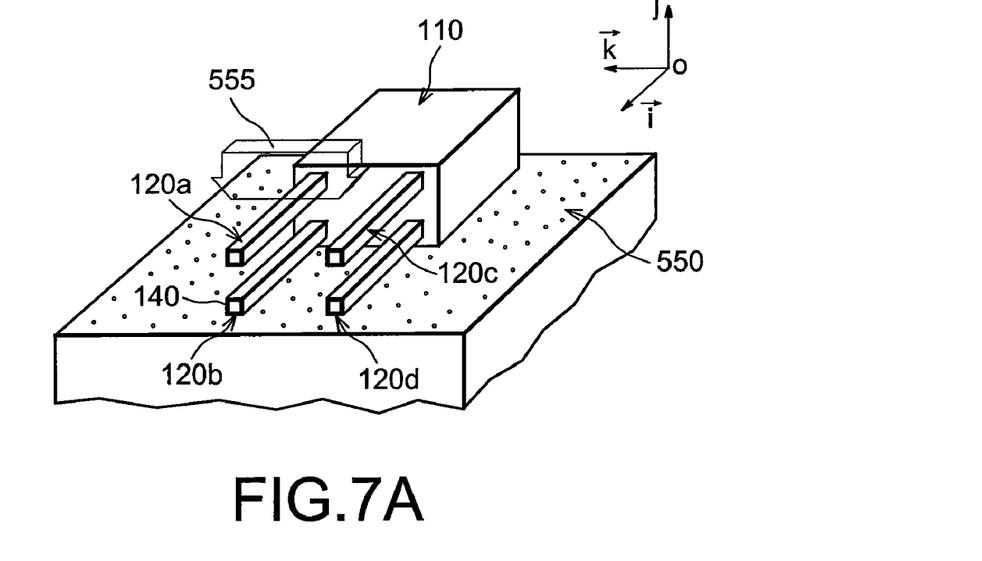
FIGS. 7A to 7B illustrate, in a perspective view, the stages of a variant of the method for the creation of a microelectronic device according to the invention.
Figure 7B:
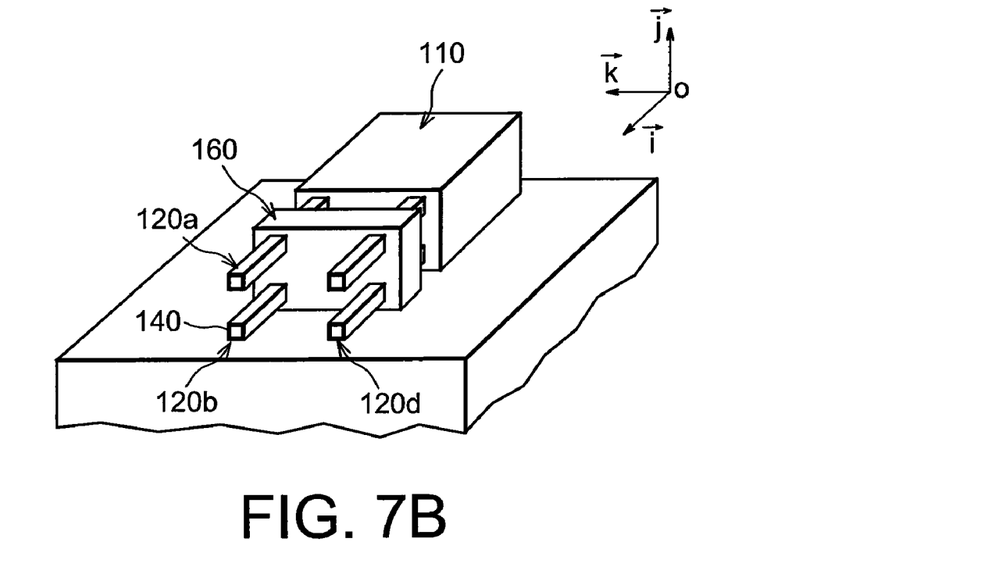

According to a variant of the formation of the gate (160) described above, the latter can be created using a deposition assisted by an electron beam (555). The electron beam (555) can be the type used in the document entitled "*Metal delocalization and surface decoration in direct write nanolithography by electron beam induced deposition*, Vidyut Gopal et al. *Applied Physics letters* Volume 85, No. 1, July 2004, 5$^{th}$", for example, or in the document entitled "*Integrated tungsten nanofiber field emission cathodes selectively grown by nanoscale electron beam induced deposition*, X. Yang et al., *Applied Physics letters* 86, 183106 2005" or in the document entitled "*Growth and simulation of high aspect ratio nanopillars by secondary electron induced deposition*", *Journal of Vacuum Science & Technology B: Microelectronics and Nanometer Structures*, November 2005, Vol. 23, Issue x, p 2825-2832. The energy to accelerate the electron beam (555) can be between several hundreds of eV and several tens of keV. For this variant, after the deposition of the gate dielectric layer (140), under an electron beam (555), a precursor (550) is injected in the form of vapour, which includes at least one metallic element. The structure (105) is thus placed in a precursor vapour (550) (see FIG. 7A). The precursor (550) chosen is suitable to be broken down into at least one metallic material after having been exposed to an electron beam. In a case, for example, in which the gate material that one wishes to deposit is W, the precursor (550) can be $WF_6$ in the form of a vapour injected at ambient temperature. In another case, in which the gate material that one wishes to deposit is Pt for example, the precursor (550) can be (CH3)₃CH₃C₅H₄Pt, heated to be in the form of a vapour. The electron beam (555) is directed toward the parts of the structure (105) on which one wishes to achieve the deposition. The precursor (550) can be adsorbed at the surface of the structure (105) and broken down by the beam (555) so as to form deposits based on said metallic element on the structure (105). The exposure of the precursor (550) to the beam (555) enables one to concentrate the metallic element intended to play the role of gate material at places in the device that are insulated by the electron beam (555). The deposits based on said metallic element can respectively form closed contours around the bars (120a, 120b, 120c, 120d). The gate (160) is arranged so that zones of gate metal encircle or surround the bars (120a, 120b, 120c, 120d), over at least part of their length, or form a closed ring or band around the bars (120a, 120b, 120c, 120d) (see FIG. 7B).

Figure 4A:
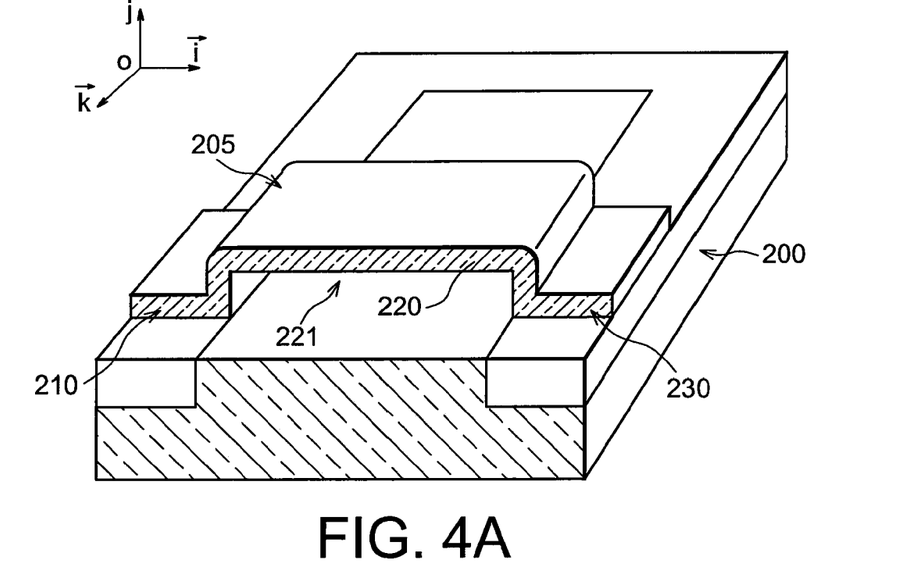
FIGS. 4A to 4C illustrate, in a perspective view, the creation of a gate on a semi-conducting structure that includes an opening using a method of the invention.

According to another implementation variant of the microelectronic method according to the invention, it is possible to form a transistor gate, using a resist layer based on precursor material (150) as described above, from a microelectronic device as illustrated in FIG. 4A. This microelectronic device includes a semi-conducting structure (205) in bridge form, resting on a substrate (200), such as of the SOI type for example. The structure (205) can be created using a method as described in document Us 2005/0037603A1 for example. The structure (205) includes a suspended semi-conducting bar (220), which is not in contact with the substrate (200) and which is intended to form a transistor channel. The length of the bar (220) can be between 50 nanometers and 1 micrometer for example, or between 40 nanometers and 300 nanometers. The bar (220) can have a thickness (specified in FIG. 4A in a direction parallel to vector $\vec{j}$ of rectangular coordinate system [O; $\vec{i}$; $\vec{j}$; $\vec{k}$]) of between 3 and 200 nanometers for example, or advantageously between 3 and 20 nanometers, and a width (specified in a direction parallel to vector $\vec{k}$ of rectangular coordinate system [O; $\vec{i}$; $\vec{j}$; $\vec{k}$]) for example, between 3 nanometers and 1 micrometer for example, or advantageously between 3 and 20 nanometers. The structure (205) is connected or attached to the substrate by means of semi-conducting blocks (210, 230) intended to play the role of source region and drain region respectively. Together with the upper layer of the substrate on which it is resting, the structure (205) forms a space (221) or an opening (221) or a cavity (221).

A deposition of a dielectric gate layer (240) is achieved on said structure (205).

On said structure (205), we then perform a deposition of the resist layer based on a precursor material (150) (illustrated using broken lines in FIG. 4B) that are sensitive to the effect of projecting electrons. Deposition of the precursor material (150) is achieved so as to at least partially fill in the cavity (221).

Figure 4B:
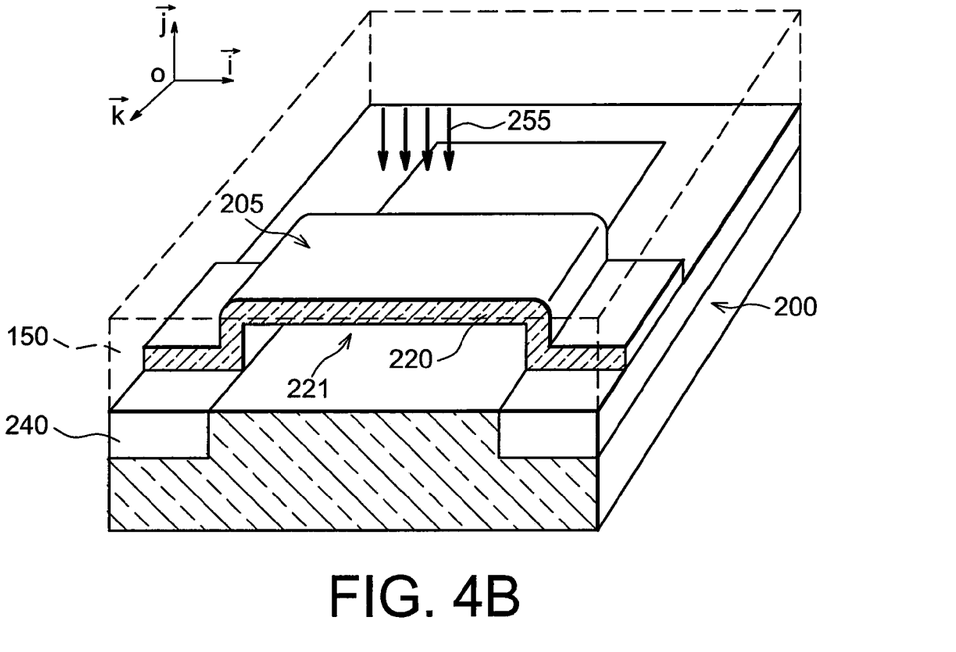

One then expose the resist layer based on the precursor material (150) to an electron beam (255), and in particular a zone of said precursor material (150) forming a ring around the semi-conducting bar (220). Regions of the resist layer based on precursor material (150) located in the cavity (221) under the semi-conducting bar (220) can thus be exposed to the electron beam.

In the case in which the precursor material (150) is an organometallic material, then after exposure to the electron beam, it is possible to achieve a reduction of the organometallic material so as to form a metallic zone at the parts of the precursor material (150) exposed to the beam.

Figure 4C:
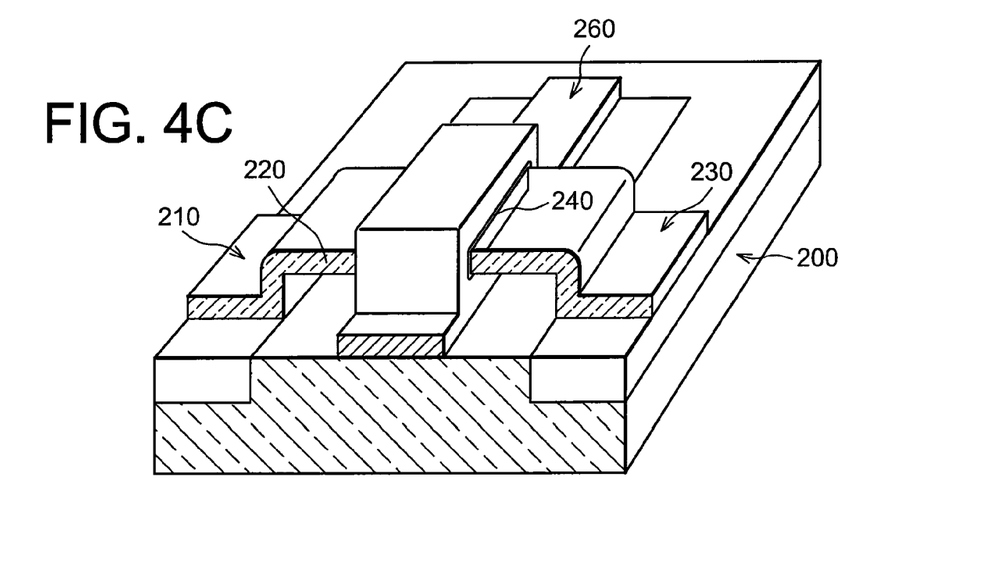

One then achieve removal of the unexposed zones of the resist layer. This removal can be achieved by washing for example, or by sublimation in the case in which the precursor material (150) is organometallic. In the case in which the precursor material (150) is a compound of a mineral nature that includes a metallic element, namely a fluoridated compound such as $BaF_2$, $SrF_2$, $MgF_2$, or $LaF_3$, this removal can be performed by dissolving in water for example. In another case in which the precursor material (150) is a compound such as $FeF_2$, $CrF_2$, or $AlF_3$, then removal can be performed using an oxidising solution for example, of the so-called "Caro 3:1" type for example, formed from a mixture of 3 volumes of 96% sulphuric acid for example per volume of 30% oxygenated water for example, or of fuming nitric acid. The parts of the resist layer based on precursor material (150) deposited under the semi-conducting bar (220) that are located in the space or the cavity (221) and that have not been exposed to the beam (255), are removed. The metallic zone forms a metallic gate (260), of the so-called "surrounding" type, creating a closed contour around a portion of the semi-conducting bar (220) (see FIG. 4C). According to another creation option, the "surrounding" metallic gate (260) can be formed by deposition (of the type described previously with reference to FIGS. 7A-7C) by an electron beam using a metallic precursor in the form of a vapour.

Figure 5A:
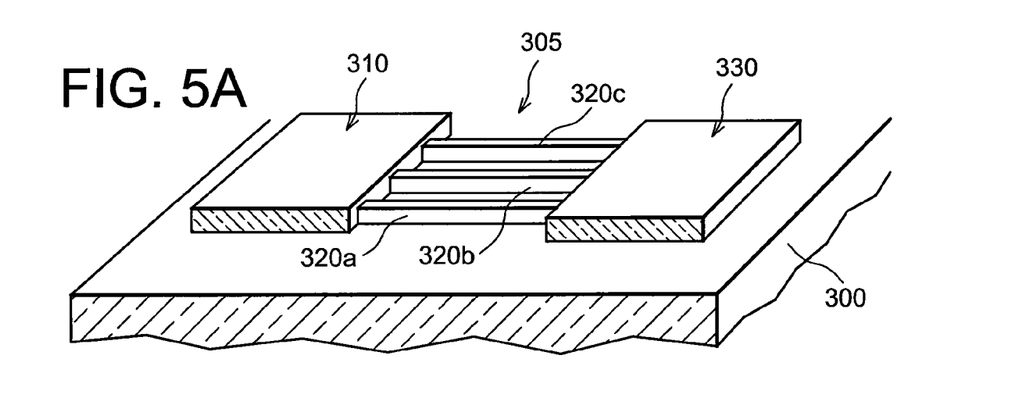
FIGS. 5A to 5B illustrate, in a perspective view, the creation of a gate on a structure that includes juxtaposed semi-conducting bars using a method of the invention.

According to another implementation variant of the microelectronic method according to the invention, it is possible to form a so-called "partially surrounding" transistor gate, using the precursor material (150) as described above, from a microelectronic device as illustrated in FIG. 5A. This microelectronic device includes a semi-conducting structure (305) that has several semi-conducting bars (320a, 320b, 320c), which are distinct and juxtaposed on a substrate (300), of the SOI type for example. The structure (305) can be created using a method as described in the document entitled "*Nanoscale CMOS Spacer FinFET for the Terabit Era*", Choi et al., *IEEE Electron device letters*, for example, Vol. 23, No. 1, January 2002 for example. This semi-conducting structure (305) links a first semi-conducting block (310) that is intended to play the role of source region, and a second semi-conducting block (330) that is intended to play the role of drain region.

On said structure (305), one execute a deposition of a layer of dielectric gate material (340). This layer is then etched so as to preserve said dielectric material (340) only on part of the bars (320a, 320b, 320c).

One then perform the deposition on the structure (305) of the resist layer based on a precursor material (150) The precursor material (150) can be deposited on the structure (305) so as to cover the top of the bars (320a, 320b, 320c), as well as the sides of the latter.

The zones of the resist layer based on precursor material (150) are then exposed to an electron beam.

Figure 5B:
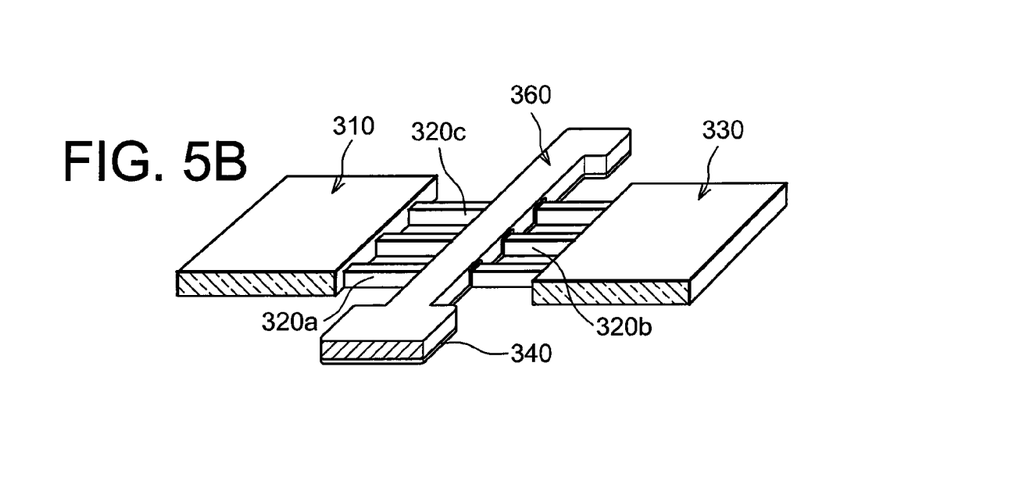

In a case in which the precursor material (150) is an organometallic material, we then perform a reduction of the organometallic material. A metallic deposition (360) is formed at places in the layer of precursor material (150) that have been exposed to the electron beam. One then remove the zones of the layer of precursor material (150) not exposed to the electron beam. The resulting metallic deposition (360) forms a gate that covers a part of the top and sides of the bars (320a, 320b, 320c) (see FIG. 5B).

According to a variant of the example of method that has just been described, the gate (360), can be formed using an organometallic precursor material that is photosensitive. This photosensitive organometallic material is chosen so as to be capable of being broken down into at least one metallic material under the effect of a light beam such as an ultra-violet light beam. The photosensitive organometallic material can, for example, be that previously described with reference to FIG. 3. In this variant, one achieve a deposition of the photosensitive organometallic material on the structure (305), and then one achieve an exposure of certain zones of the layer of photosensitive organometallic material using an ultra-violet light beam. We then perform a reduction of the organometallic material so as to form one or more metallic zones on said structure (305) at the level of said zones exposed to the ultra-violet light beam. The zones of the layer of photosensitive organometallic material that have not been exposed are then removed.

Figure 6A:
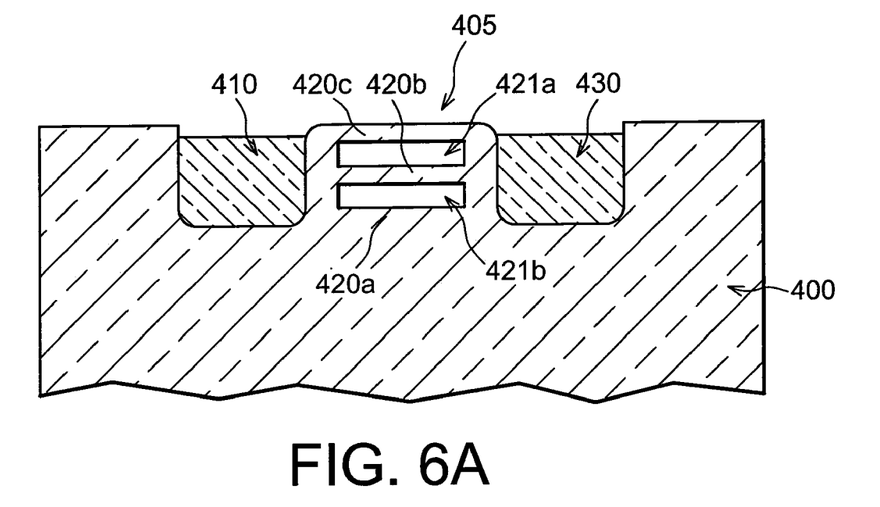
FIGS. 6A to 6D illustrate, in a perspective view, the creation of a gate on a structure that includes semi-conducting bars, separated from each other by a cavity, using a method of the invention.

Another implementation variant of the microelectronic method according to the invention includes the formation of a transistor gate using a precursor material (150) from a microelectronic device as illustrated in FIG. 6A. This microelectronic device includes a so-called "multi-bridge" semi-conducting structure (405). The structure (405) can be created using a method as described in the document entitled "*A Novel MBC (Multi-Bridge-Channel) MOSFET: Fabrication technologies and characteristics*, Kim et al., *IEEE transactions on nanotechnology*, Vol. 2, No. 4, December 2003". The "multi-bridge" structure (405) is deposited on a substrate (400) and is formed of several superimposed semi-conducting bars (420a, 420b, 420c), connecting a source region (410) and a second drain region (430). The structure (405) includes cavities or openings (421a, 421b) between bars 420a and 420b and between bars 420b and 420c respectively.

Figure 6B:
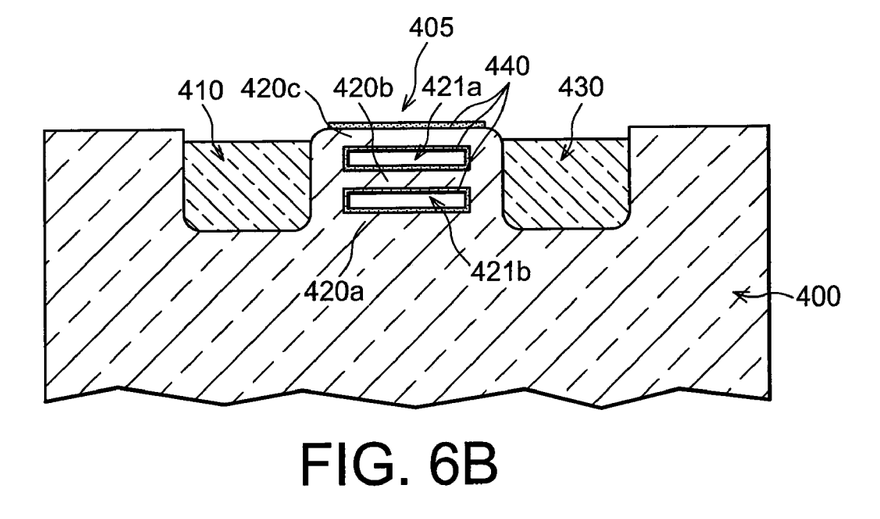

We create a gate dielectric (440), such as by oxidation of the semi-conducting bars (420a, 420b, 420c) on the structure (405) and in the cavities (421a, 421b) (see FIG. 6B).

Figure 6C:
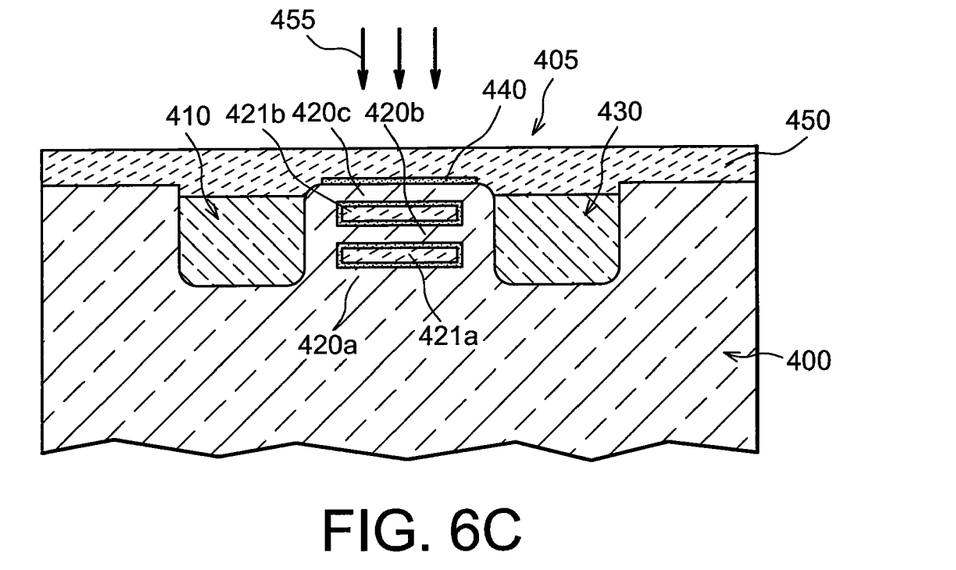
Figure 6D:
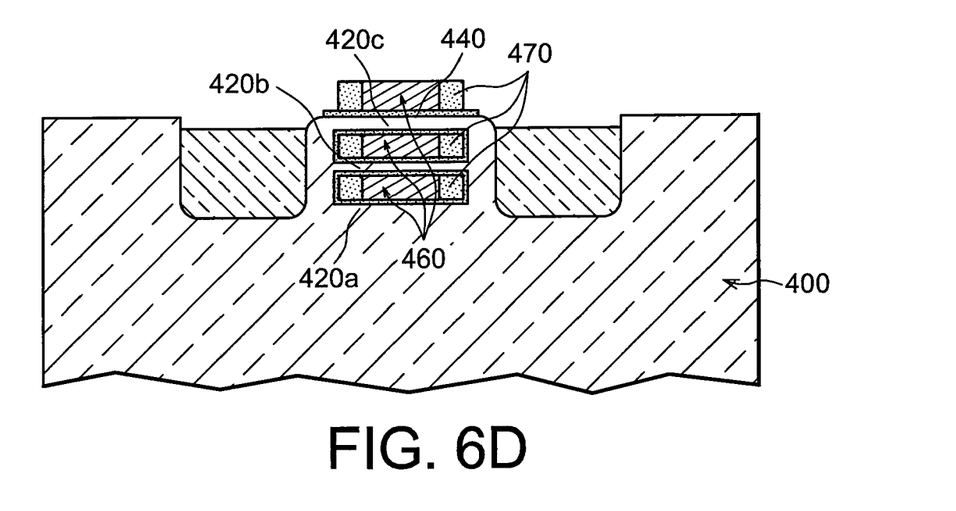

On said structure (405), and in the cavities (421a, 421b), We then achieve the deposition of a resist layer based on a precursor material (150). The precursor material (150) chosen can be as described above, and capable of being broken down into at least one metallic material following exposure to an electron beam. We then expose zones of the resist layer based on the precursor material (150) to an electron beam (455), in a gate pattern that one wishes to create. Zones of the resist material (150) located inside the cavities (421a, 421b) are thus exposed to the beam (455) (see FIG. 6C). In a case in which the precursor material (150) is an organometallic material, we then perform a reduction of the organometallic material so as to form metallic zones (460) at the positions that were occupied by the material (150) and that have been exposed to the beam (455). We then remove the unexposed zones of the material (150) in the places that have not been exposed to the beam (455). The metallic zones (460) form a gate of the GAA type, surrounding or surrounding the bars (420a, 420b, 420c). Insulating spacers (470) can then be created by deposition of nitride for example or by the formation of a silicon oxide (see FIG. 6D).

The invention claimed is:

1. A method for the fabrication of a microelectronic device with one or more transistors, which includes the fabrication of at least one transistor gate on a semi-conducting structure that comprises at least one first semi-conducting block and at least one second semi-conducting block resting on a substrate, with one or more semi-conducting bars connecting the first block and the second block, said semi-conducting bars being suspended above the substrate and not in contact with the substrate, said semi-conducting bars being designed to form one or more transistor channels, the fabrication of said gate comprising the steps of:

a) depositing over at least part of said semi-conducting structure of at least one layer based on an organometallic precursor material, wherein said depositing being achieved so as to fill in at least one zone under said suspended bars by means of said precursor material, b) exposing one or more zones of the layer based on the organometallic precursor material to at least one electron beam so as to reach parts of the precursor material located under said suspended bars, c) reducing of the organometallic precursor material so as to form one or more metallic zones on said structure at the level of said zones exposed to the beam or beams, at least one of said metallic zones forming a closed ring or a closed band around said suspended bars.

2. A microelectronic method according to claim 1, in which said organometallic precursor material is based on the following compound or on the following molecule:

where:
M is a metal that can be chosen from among the following metals—platinum, copper, rhodium, tungsten, iridium, silver, gold, tantalum and palladium,
A is an atom or a molecule that can be chosen from the following list—oxygen, sulphur, the amine group, the amide group or the ester group,
X is an a number chosen from 0 and 1,
L is a ligand,
R is a fluoro-organic group, where the metallic zones formed at step c) are based on the metal M.

3. A method for the fabrication of a microelectronic device according to claim 1 which, after exposing to said electron beam, also includes removing unexposed zones of the layer of precursor material.

4. A method for the fabrication of a microelectronic device according to claim 1, further including depositing at least one gate dielectric layer after forming said structure and prior to step a).

5. A method for the fabrication of a microelectronic device with one or more transistors, which includes the fabrication of at least one transistor gate on a semi-conducting structure that includes at least one first semi-conducting block and at least one second semi-conducting block resting on a substrate, with one or more semi-conducting bars connecting the first block and the second block, said semi-conducting bars being suspended above the substrate and not in contact with the substrate, said semi-conducting bars being designed to form one or more transistor channels, wherein the fabrication of said gate has steps for:

a) depositing over at least part of said semi-conducting structure, of at least one layer of precursor material based on a compound of a mineral nature that includes at least one metallic element and that is suitable to be broken down into at least one metallic material under the effect of an electron beam, said depositing being achieved so as to fill in at least one zone under said suspended bars by means of said precursor material, b) exposing one or more zones of the layer of precursor material, to at least one electron beam, so as to reach parts of the precursor material located under said suspended bars and so as to form, on the semi-conducting structure, one or more metallic zones based on said material, at the level of said zones exposed to the beam, at least one of said metallic zones forming a closed ring or band around at least one of said semi-conducting bars.

6. A method for the fabrication of a microelectronic device according to claim 5, where said compound is a fluoridated compound.

7. A method for the fabrication of a microelectronic device according to claim 6, where said compound is chosen from among one of the following compounds: $BaF_2$, $SrF_2$, $MgF_2$, $LaF_3$, $FeF_2$, $CrF_2$, and $AlF_3$.

8. A method for the fabrication of a microelectronic device according to claim 5 which, after exposing to said electron beam, further includes removing unexposed zones of the layer of precursor material layer.

9. A method for the fabrication of a microelectronic device according to claim 5, further including at least partially removing the precursor material in said filled-in zone.

10. A method for the fabrication of a microelectronic device according to claim 5, further including the deposition of at least one gate dielectric layer after formation of said structure and prior to step a).

11. A method for the fabrication of a microelectronic device with one or more transistors, which includes the fabrication of at least one transistor gate on a semi-conducting structure that includes at least one first semi-conducting block and at least one second semi-conducting block resting on a substrate, with one or more semi-conducting bars connecting the first block and the second block, said semi-conducting bars being suspended above the substrate and not in contact with the substrate, said semi-conducting bars being designed to form one or more transistor channels, where the fabrication of said gate has steps for:
  a) placing the semi-conducting structure in a vapour of a precursor material suitable to be broken down into at least one metallic material under the effect of an electron beam,
  b) locally exposing one or more regions of said semi-conducting structure to at least one electron beam so as to reach parts of the precursor material located under said suspended bars and to form one or more metallic zones based on said metallic material on said regions of said exposed semi-conducting structure to the beam, at least one of said metallic zones forming a closed ring around at least one of said semi-conducting bars.

12. A method for the fabrication of a microelectronic device according to claim 11, including depositing of at least one gate dielectric layer after forming of said structure and prior to step a).

* * * * *